United States Patent
Liu et al.

(10) Patent No.: US 11,195,914 B2
(45) Date of Patent: Dec. 7, 2021

(54) TRANSISTOR AND METHOD FOR FORMING A TRANSISTOR

(71) Applicant: Applied Materials, Inc., Santa Clara, CA (US)

(72) Inventors: Patricia M. Liu, Saratoga, CA (US); Flora Fong-Song Chang, Saratoga, CA (US); Zhiyuan Ye, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/588,901

(22) Filed: Sep. 30, 2019

(65) Prior Publication Data

US 2021/0028280 A1 Jan. 28, 2021

Related U.S. Application Data

(60) Provisional application No. 62/879,364, filed on Jul. 26, 2019.

(51) Int. Cl.
*H01L 29/08* (2006.01)
*H01L 29/78* (2006.01)
*H01L 29/66* (2006.01)
*H01L 29/24* (2006.01)

(52) U.S. Cl.
CPC .......... *H01L 29/0847* (2013.01); *H01L 29/24* (2013.01); *H01L 29/66795* (2013.01); *H01L 29/7851* (2013.01)

(58) Field of Classification Search
CPC ................ H01L 29/0847; H01L 29/24; H01L 29/66795; H01L 29/7851
See application file for complete search history.

(56) References Cited

U.S. PATENT DOCUMENTS

| 8,713,511 B1* | 4/2014 | Clark ...................... G06F 30/30 716/136 |
| 8,999,821 B2 | 4/2015 | Brand et al. |
| 9,570,307 B2 | 2/2017 | Nainani et al. |
| 9,893,192 B2 | 2/2018 | Tanaka et al. |
| 10,170,555 B1 | 1/2019 | Liao et al. |
| 10,192,985 B2 | 1/2019 | Wu et al. |
| 10,205,002 B2 | 2/2019 | Bao et al. |
| 2008/0020533 A1* | 1/2008 | Thei ................... H01L 29/7843 438/286 |

(Continued)

FOREIGN PATENT DOCUMENTS

| EP | 2975646 B1 | 5/2017 |
| WO | 2018/004630 A1 | 1/2018 |

*Primary Examiner* — Fernando L Toledo
*Assistant Examiner* — Neil R Prasad
(74) *Attorney, Agent, or Firm* — Patterson + Sheridan, LLP

(57) ABSTRACT

Embodiments of the present disclosure relate to a transistor and methods for forming a transistor. A transistor includes a gate electrode structure disposed over a channel region, a source/drain extension region disposed adjacent to the channel region, and a source/drain region disposed on the source/drain extension region. The source/drain region includes antimony (Sb). The method of forming a transistor includes forming the source/drain extension region and forming the source/drain region on the source/drain extension region. The antimony helps prevent unwanted migration of dopants from the source/drain region to the source/drain extension region.

20 Claims, 7 Drawing Sheets

(56) References Cited

U.S. PATENT DOCUMENTS

| | | | |
|---|---|---|---|
| 2008/0124878 A1* | 5/2008 | Cook | H01L 29/7834 |
| | | | 438/300 |
| 2010/0012988 A1* | 1/2010 | Yang | H01L 21/26506 |
| | | | 257/288 |
| 2014/0231914 A1 | 8/2014 | Chang et al. | |
| 2016/0190249 A1* | 6/2016 | Hsieh | H01L 21/823814 |
| | | | 257/51 |
| 2017/0098545 A1* | 4/2017 | Woodruff | H01L 21/76889 |
| 2017/0147818 A1 | 5/2017 | Guan | |
| 2018/0069100 A1 | 3/2018 | Bauer et al. | |
| 2018/0240893 A9 | 8/2018 | Bauer et al. | |
| 2019/0140054 A1 | 5/2019 | Dewey et al. | |

* cited by examiner

TRANSISTOR AND METHOD FOR FORMING A TRANSISTOR

CROSS-REFERENCE TO RELATED APPLICATIONS

This application claims priority to U.S. Provisional Patent Application No. 62/879,364, filed Jul. 26, 2019, which is hereby incorporated by reference in its entirety.

BACKGROUND

Field

Embodiments of the present disclosure generally relate to an apparatus and a method, and more specifically, to a transistor and method for forming a transistor.

Description of the Related Art

The transistor is a key component of most integrated circuits. Since the drive current, and therefore speed, of a transistor is proportional to the gate width of the transistor, faster transistors generally require larger gate width. Thus, there is a trade-off between transistor size and speed, and "fin" field-effect transistors (FinFETs) have been developed to address the conflicting goals of a transistor having maximum drive current and minimum size. FinFETs are characterized by a fin-shaped channel region that greatly increases the size of the transistor without significantly increasing the footprint of the transistor, and are now being applied in many integrated circuits.

For example, in n-channel metal-oxide semiconductor (nMOS) devices, strong diffusion of phosphorous atoms from heavily phosphorus doped silicon (Si:P) regions into the channel is a concern in smaller FinFETs. Thus, while higher concentrations of phosphorous atoms allow very low contact resistance and can beneficially reduce resistivity in the source and drain regions of a FinFET, the risk of phosphorus atoms diffusing from a source/drain extension into the channel is greatly increased, particularly for FinFETs having smaller dimensions. Control of phosphorus migration is critical to achieve 3 nm nodes and beyond. In some cases, additional doped layers are added to reduce migration of phosphorus atoms.

One drawback with FinFETs in the art is that the dopants used, such as arsenic, are not always completely successful in preventing phosphorus migration. In addition, arsenic is highly toxic. Arsenic doped layers have similar tensile strain as Si:P layers, therefore P diffusion will not experience strong strain effects.

Therefore, there is a need for transistors with features to prevent P migration.

SUMMARY

In one embodiment, a transistor is provided, including a gate electrode structure disposed over a channel region, a source/drain extension region disposed adjacent to the channel region, and a source/drain region disposed on the source/drain extension region. The source/drain region includes antimony (Sb).

In another embodiment, a method for forming a transistor is provided, including forming a source/drain extension region disposed adjacent to a channel region and disposed under a gate electrode structure, and forming a source/drain region on the source/drain extension region. The source/drain region includes antimony (Sb).

In yet another embodiment, a method for forming a transistor is provided, including forming a gate electrode structure and a gate spacer over a first portion of a semiconductor fin, a second portion of the semiconductor fin being exposed, removing the second portion of the semiconductor fin to expose a portion of the semiconductor fin having a side wall and a bottom, the portion comprising a source/drain extension region, forming an antimony-doped semiconductor layer disposed on the portion of the semiconductor fin, and forming a source/drain region on the antimony-doped semiconductor layer. The source/drain region includes antimony (Sb).

The presence of antimony-doped semiconductor layer and the source/drain regions prevents unwanted P diffusion. The P dopant concentration in the source/drain regions is maintained since the migration of P is reduced.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a transistor and methods of forming a transistor. A transistor, such as a FinFET, includes a channel, a source/drain region, and a source/drain extension region. In some embodiments, a source/drain region is deposited over the source/drain extension region, the source/drain region including antimony. The antimony in the source/drain region reduces migration of phosphorus into the source/drain extension region. The transistor can include an antimony-doped semiconductor layer between the source/drain region and the source/drain extension region, which further prevents unwanted migration of phosphorus. Embodiments of the disclosure may be useful for, but are not limited to, the inclusion of antimony in a FinFET structure.

As used herein, the term "about" refers to a +/−10% variation from the nominal value. It is to be understood that such a variation can be included in any value provided herein.

Figure 1:
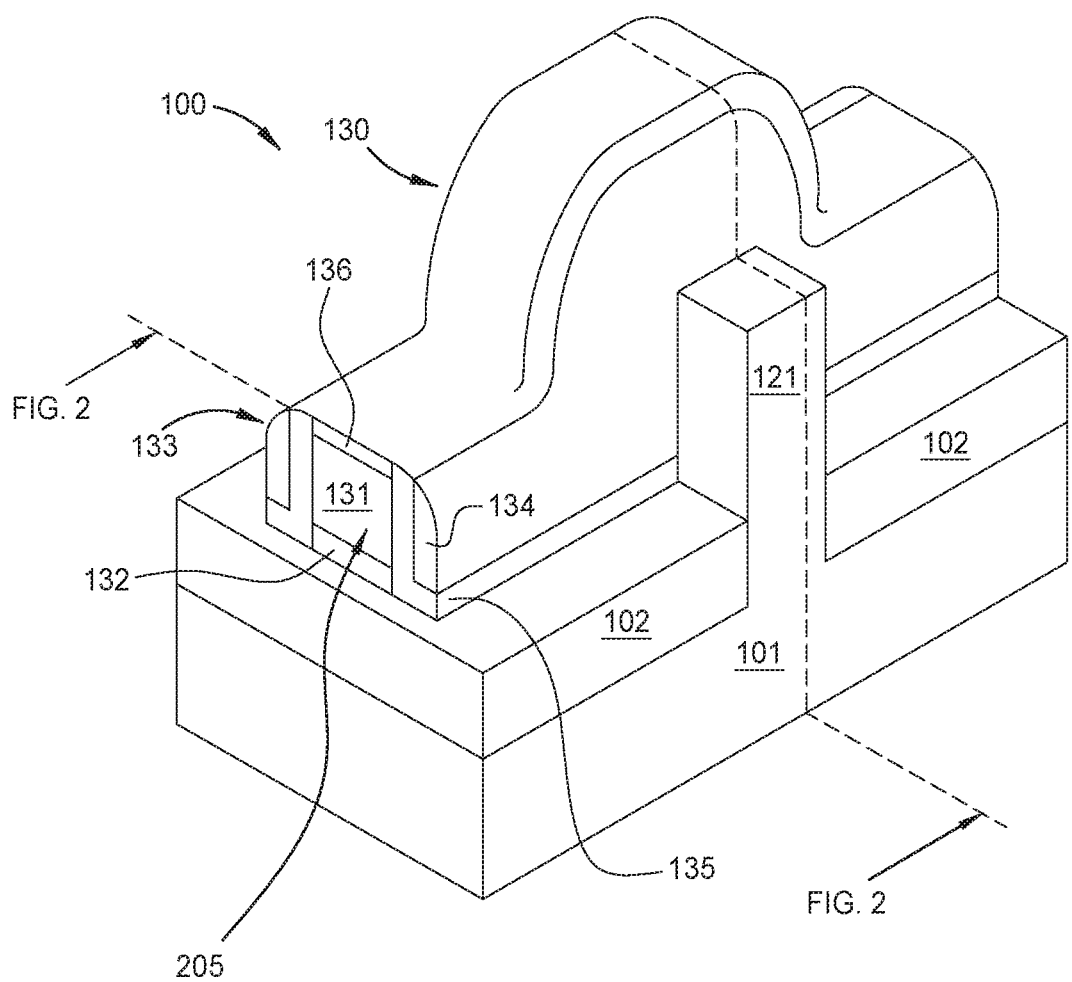
FIG. 1 illustrates a schematic perspective view of a FinFET, according to one embodiment.

FIG. 1 illustrates a schematic perspective view of a FinFET 100, alternately referred to as a transistor, according to one embodiment. As shown, the FinFET 100 includes a semiconductor substrate 101, insulation regions 102, a semiconductor fin 121, and a gate electrode structure 130. The insulation regions 102 are disposed on the semiconductor substrate 101. The semiconductor fin 121 extends from the semiconductor substrate 101. The gate electrode structure 130 is disposed on the insulation regions 102 and the semiconductor fin 121. A top portion of the semiconductor fin 121 is exposed and electrically coupled to a source contact (not shown) of the FinFET 100, another top portion of semiconductor fin 121 is exposed and electrically coupled to a drain contact (not shown) of the FinFET 100, and a center portion of the semiconductor fin 121 includes the channel region of the FinFET 100. The FinFET 100 is configured to control currents through the source contact and the drain contact by application of a gate voltage to the gate electrode structure 130. The FinFET 100 can be an nMOS or a p-channel MOS (pMOS), depending on the dopants used.

The semiconductor substrate 101 can include silicon (Si), germanium (Ge silicon-germanium (SiGe), or any other suitable semiconducting substrate. The insulation regions 102 can include one or more dielectric materials, such as silicon dioxide ($SiO_2$), silicon nitride ($Si_3N_4$), or any mixture thereof. The insulation regions 102 can be formed by high-density plasma (HDP), flowable chemical vapor deposition (FCVD), or the like.

A fin spacer (not shown for clarity) can be disposed on sidewalls of the semiconductor fin 121. The semiconductor fin 121 can be formed from the semiconductor substrate 101 or from a different semiconductor material that is deposited on the semiconductor substrate. In the latter case, the different semiconductor material can include SiGe, a III-V compound semiconductor material, or the like.

As shown, the gate electrode structure 130 includes a gate electrode layer 131, a gate dielectric layer 132, gate spacers 133, and a mask layer 136, according to one embodiment. The gate electrode layer 131 can include a polysilicon layer or a metal layer that is capped with a polysilicon layer. The gate electrode layer 131 can include metal nitrides (such as titanium nitride (TiN), tantalum nitride (TaN) or molybdenum nitride ($MoN_x$)), metal carbides (such as tantalum carbide (TaC) or hafnium carbide (HfC)), metal-nitride-carbides (such as TaCN), metal oxides (such as molybdenum oxide ($MoO_x$)), metal oxynitrides (such as molybdenum oxynitride ($MoO_xN_y$)), metal silicides (such as nickel silicide), and combinations thereof.

The gate dielectric layer 132 can include silicon oxide ($SiO_x$), which can be formed by a thermal oxidation of the semiconductor fin 121, or by any suitable deposition process. Suitable materials for forming the gate dielectric layer 132 include silicon oxide, silicon nitrides, oxynitrides, metal oxides such as hafnium oxide ($HfO_2$), hafnium zirconium oxide ($HfZrO_x$), hafnium silicon oxide ($HfSiO_x$), hafnium titanium oxide ($HfTiO_x$), hafnium aluminum oxide ($HfAlO_x$), and combinations and multi-layers thereof. The gate spacers 133 are formed on sidewalls of the gate electrode layer 131, and each gate spacer 133 includes a nitride portion 134 and/or an oxide portion 135 as shown. The mask layer 136 is formed on the gate electrode layer 131, and can include silicon nitride. The gate electrode structure 130 serves as the gate of the FinFET 100.

Figure 2:
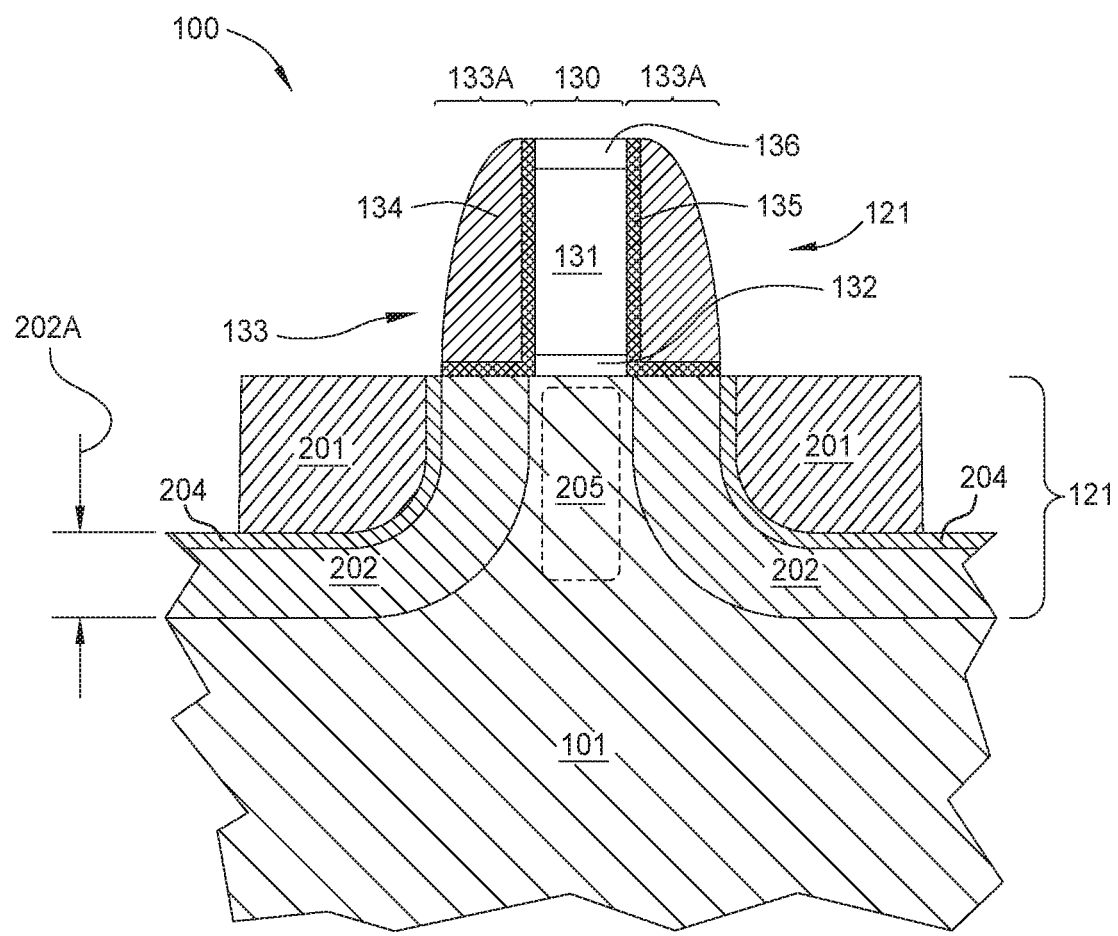
FIG. 2 illustrates a schematic cross-sectional view of the FinFET of FIG. 1, according to one embodiment.

FIG. 2 illustrates a schematic cross-sectional view of FinFET 100, according to one embodiment. As shown in FIG. 2, the semiconductor fin 121 includes source/drain regions 201, antimony-doped semiconductor layers 204, source/drain extension regions 202, and a channel region 205. The source/drain regions 201 include relatively high concentrations of n-type dopants, such as phosphorus, arsenic, antimony, or any combination of the above. The dopant includes phosphorus (P), according to one embodiment. The P and/or Sb dopant concentration is variable throughout the source/drain regions 201, according to one embodiment. The concentration of n-type dopants in the source/drain regions 201 can be as high as 5E21 atoms/$cm^3$. The source/drain regions 201 can be produced by any suitable method, such as an in-situ doping of a semiconductor layer using an epitaxial deposition process. The gate spacers 133 are disposed over the source/drain extension regions 202, according to one embodiment.

It is understood that P-doping decreases the lattice constant of Si, which results in tensile strain of the source/drain regions 201. Sb-doping increases the lattice constant of Si, resulting in compressive strain of the source/drain regions 201. In embodiments where the source/drain regions 201 include both Sb and P dopants, the Sb-dopant-induced strain counteracts the P-dopant-induced strain, reducing the overall strain in the source/drain regions 201. The Sb dopant concentration is about 1E19 atoms/$cm^3$ to about 1E21 atoms/$cm^3$ in the source/drain regions 201, according to one embodiment. A Sb dopant concentration of about 1E19 atoms/$cm^3$ to about 1E21 atoms/$cm^3$ in the source/drain regions 201 reduces the migration of P dopants, maintaining desired P concentration in the source/drain regions. The P concentration still dominates the source/drain regions 201, so that the source/drain regions maintain better activation. In addition, Sb is less toxic than alternatives such as arsenic.

Each source/drain region 201 is disposed on the antimony-doped semiconductor layer 204, according to some embodiments. The antimony-doped semiconductor layer 204 has a thickness ranging from about 1 nm to about 10 nm. The antimony-doped semiconductor layer 204 can be deposited by any suitable method, such as an epitaxial deposition process. The antimony-doped semiconductor layer 204 can comprise the material of the substrate 101. The antimony-doped semiconductor layer 204 can be formed by doping a portion of the source/drain extension regions 202. The Sb dopants prevent or reduce the unwanted migration of dopants in the source/drain region 201, such as P, from migrating to the source/drain extension regions 202 and channel region 205.

The antimony-doped semiconductor layer 204 is disposed over the source/drain extension region 202, according to some embodiments. The source/drain extension regions 202 can be doped with Sb and/or As. In general, dopant levels at the interface between the channel region 205 and the source/drain extension regions 202 should be low in order to prevent unwanted dopant migration from the source/drain extension regions to the channel region. The source/drain extension regions 202 are typically desired to be thin and conductive, in order to improve channel region 205 performance in the FinFET 100. If the source/drain extension regions 202 are too conductive, the coupling between the gate electrode structure 130 can become too strong and the performance of the FinFET 100 is negatively affected. If the dopants from the source/drain region 201, for example P, diffuse to the source/drain extension regions 202, the source/drain extension regions become diffusively doped and creating a graded dopant profile in the source/drain extension regions. Therefore, slowly diffusing dopants, such as As or Sb, are used in the source/drain extension regions 202 in controlled graded doping levels to improve FinFET 100 performance.

The source/drain extension regions 202 can be formed with a thickness 202A that is substantially the same as the width 133A of gate spacers 133. With the small geometries associated with modern FinFET devices, a width 133A of gate spacers 133, which is also approximately the distance between the channel region 205 and the source/drain region 201, can be just a few nanometers. Conventionally, the undoped source and drain extension regions are first partially removed, and doped source and drain extension regions are formed on both sides of the channel region, which requires control of portions removed. Dopants can diffuse into the channel region during the formation of the doped source and drain extension regions. Alternatively, doping the undoped source and drain extension regions by any doping method can also lead to diffusion of dopant into the channel region, and thus control of dopant concentration improves the functioning of the FinFET.

The diffusion of Sb atoms from the antimony-doped semiconductor layers 204 to the source/drain extension regions 202 can be controlled by performing a thermal treatment process on the antimony-doped semiconductor layers prior to depositing the source/drain regions 201. The thermal treatment process can be a spike anneal process performed at temperatures of about 900° C. to about 1200° C. at a time for about 1 seconds to about 30 sec. Due to the large size of the Sb atoms, the Sb atoms do not appreciably diffuse during the short time period of the spike anneal, and thus the Sb atoms migration is reduced.

Figure 3:
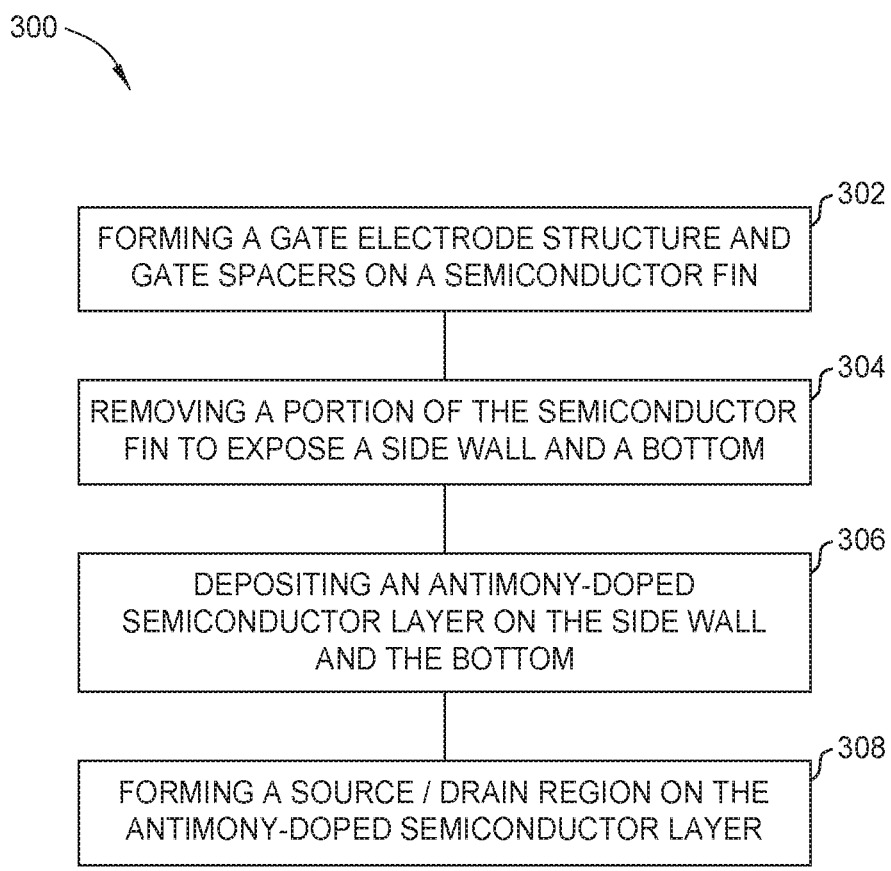
FIG. 3 is a flowchart of method operations for forming a FinFET, according to one embodiment.

FIG. 3 is a flowchart of method 300 operations for forming a FinFET 100, according to one embodiment. Although the method 300 operations are described in conjunction with FIGS. 3 and 4A-4D, persons skilled in the art will understand that any system configured to perform the method operations, in any order, falls within the scope of the embodiments described herein. Although the method 300 is illustrated for forming an n-type doped source/drain extension region 202, the method can be employed to form other structures on the substrate 101 as well.

Figure 4A:
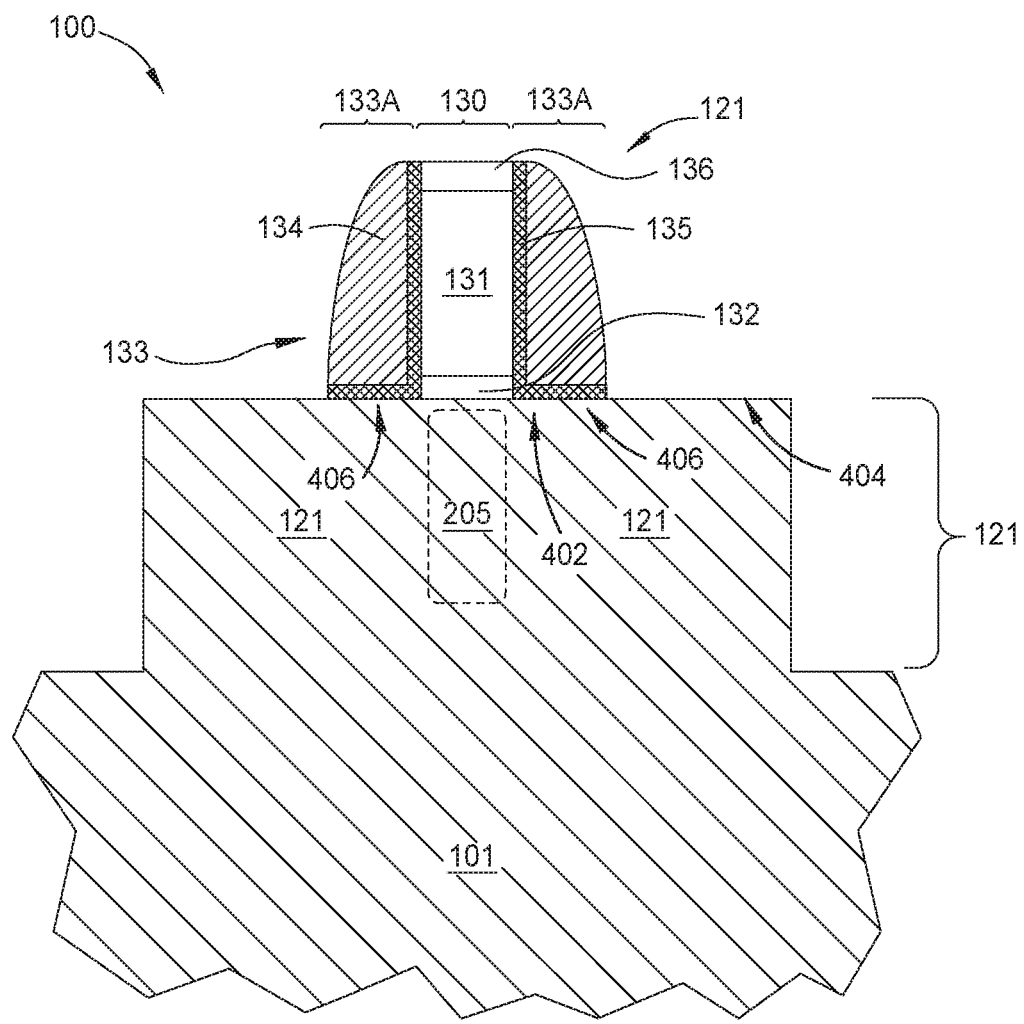
FIGS. 4A-4D illustrate schematic cross-sectional views of a FinFET during various stages of the method of FIG. 3, according to one embodiment.

As shown in FIG. 3, the method 300 starts at operation 302, in which the gate electrode structure 130 and the gate spacers 133 are formed on the semiconductor fin 121, as illustrated in FIG. 4A, according to one embodiment. The gate electrode structure 130 and the gate spacers 133 are deposited on a first portion 402 of the semiconductor fin 121, and a second portion 404 of the semiconductor fin is exposed. The first portion 402 of the semiconductor fin 121 includes the channel region 205 disposed below the gate electrode structure 130 and a third portion 406 disposed below the gate spacers 133.

Figure 4B:
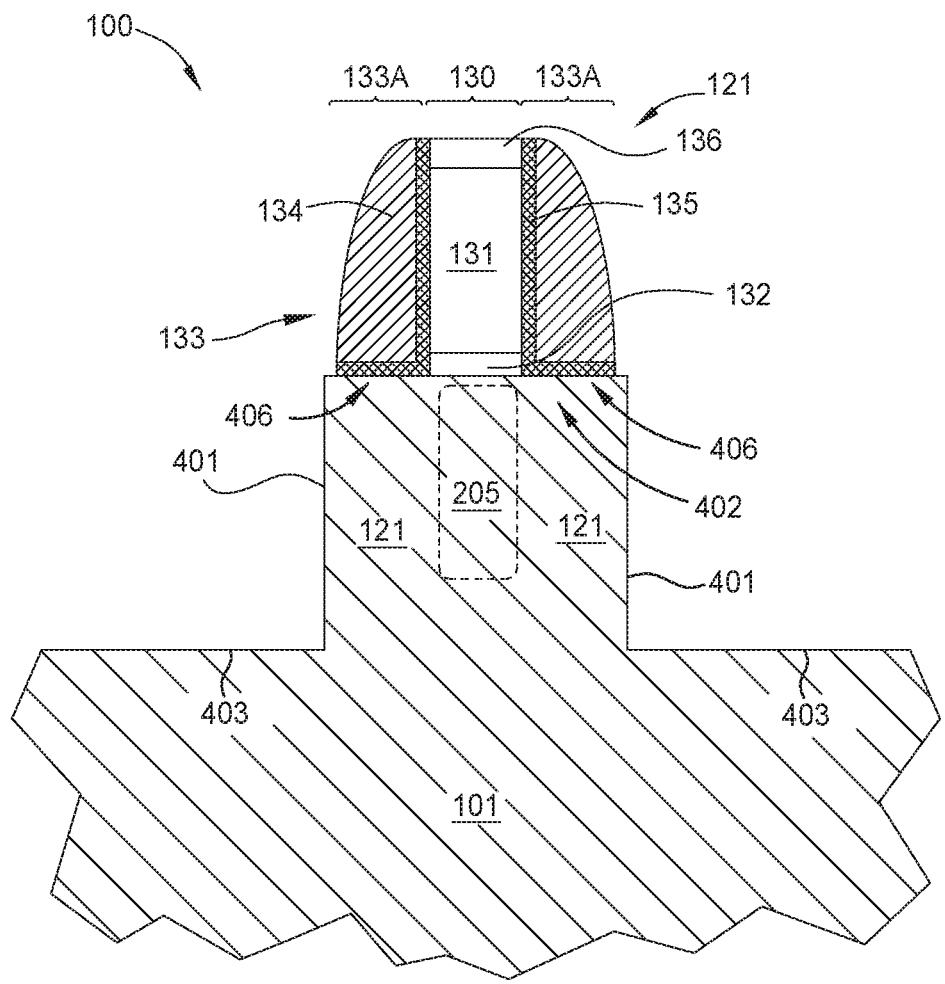

At operation 304, the second portion 404 of the semiconductor fin 121 is removed, as illustrated in FIG. 4B, according to one embodiment. The operation 304 can include an etch process, such an anisotropic etch process, according to one embodiment. The anisotropic etch process can be, for example, a deep reactive-ion etch (DRIE) process during which gate electrode structure 130 and gate spacers 133 are masked. The etch process exposes side walls 401 of the third portion 406 of the semiconductor fin and bottoms 403, and the bottoms 403 are a surface of the semiconductor substrate 101. The amount of the second portion 404 removed is from about 20 Å to about 30 Å.

Figure 4C:
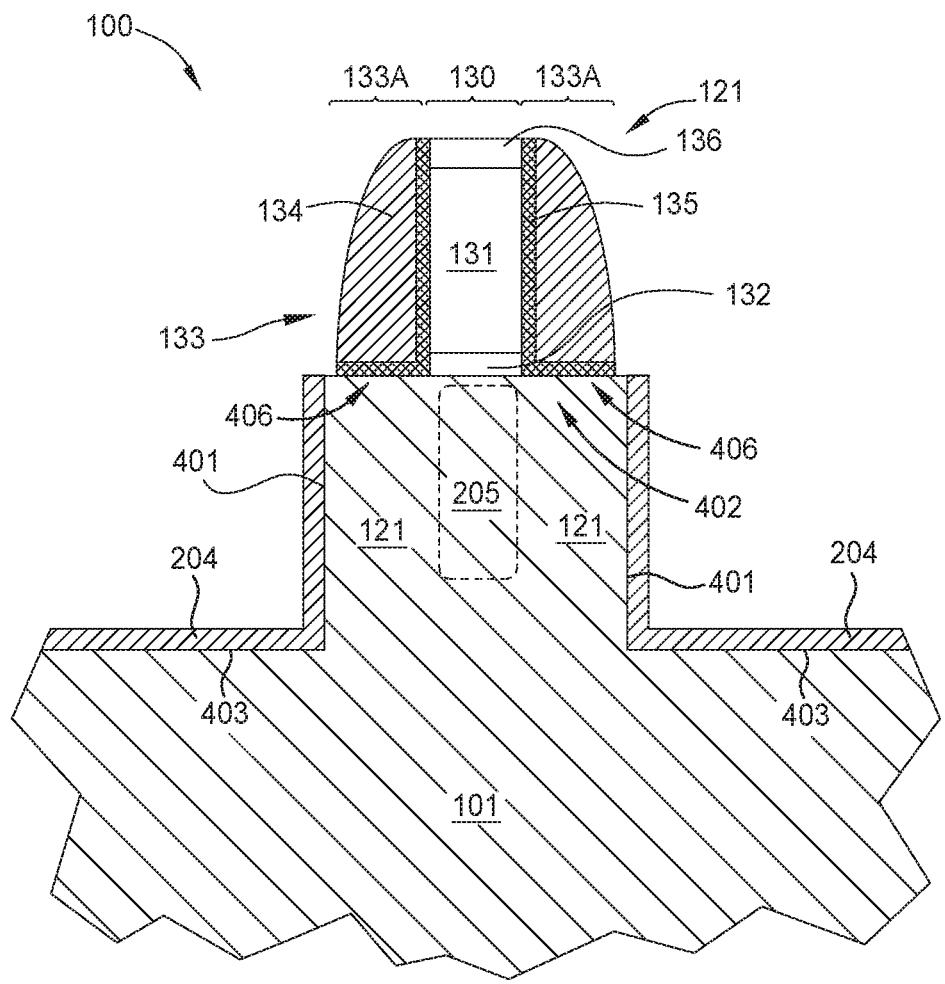

At operation 306, the antimony-doped semiconductor layer 204 is deposited on the side wall 401 and the bottom 403, as illustrated in FIG. 4C, according to one embodiment. The antimony-doped semiconductor layer 204 can have a thickness ranging from about 1 nm to about 10 nm. The antimony-doped semiconductor layer 204 can be deposited by an epitaxial deposition process, such as a selective epitaxial deposition process. For example, the antimony-doped semiconductor layer 204 is deposited on the side wall 401 and the bottom 403, which are fabricated from a semiconductor material, such as Si, and the antimony-doped semiconductor layer is not deposited on the gate spacers 133 and the mask layer 136, which are fabricated from a dielectric material. The deposition process can be performed at a chamber pressure ranging from about 1 torr to about 600 torr, such as from about 10 torr to about 20 torr, and at a deposition temperature (temperature of the substrate) ranging from about 500° C. to about 700° C., such as from about 600° C. to about 675° C.

A semiconductor containing precursor and a Sb containing precursor are flowed into the process chamber. The semiconductor containing precursor can include silicon, for example, such as silane ($SiH_4$), disilane ($Si_2H_6$), dichlorosilane ($SiCl_2H_2$) (DCS), trichlorosilane ($SiC_3H$) (TCS), any mixture of the above, or any suitable silicon containing precursor. The semiconductor containing precursor can have a flow rate ranging from about 1 sccm to about 1000 sccm, such as 1 sccm to about 500 sccm, or 10 sccm to about 1000 sccm. The antimony containing precursor can be any suitable precursor, such as antimony telluride (SbTe), according to one embodiment. The antimony containing precursor may have a flow rate ranging from about 0.1 sccm to about 100 sccm. In some embodiments, a carrier gas, such as nitrogen gas ($N_2$) or hydrogen gas ($H_2$), can be flowed with the semiconductor containing precursor and the arsenic containing precursor. An etchant is flowed with the semiconductor containing precursor and the antimony containing precursor in order to perform selective etch back to improve selectivity of the semiconductor-Sb deposition, according to one embodiment. An example of the etchant is hydrochloric acid (HCl).

The amount of excessive point defects in the antimony-doped semiconductor layer 204 can be controlled by varying processing conditions, such as partial pressure of the precursors, ratio of the precursors, processing temperature, and/or layer thickness. The amount of excessive point defects in the antimony-doped semiconductor layer 204 can control the Sb atoms diffusion into the third portions 406 of the semiconductor fin 121. During the deposition of the antimony-doped semiconductor layer 204, Sb atoms can be diffused into the third portion 406 of the semiconductor fin 121. P-dopants can also be added to the antimony-doped semiconductor layer 204. The resistivity of the antimony-doped semiconductor layer 204 is about 0.8 $\Omega \cdot cm$, whereas the resistivity of the P-doped antimony-doped semiconductor layer can be reduced further to about 0.5 $\Omega \cdot cm$ to about 0.6 $\Omega \cdot cm$. Examples of a P containing precursor to introduce P-dopants include phosphine ($PH_3$).

Forming the P-doped antimony-doped semiconductor layer 204 can include depositing the source/drain regions in a first step, and then doping the source/drain regions in a second step. In some embodiments, the doping of the antimony-doped semiconductor layer 204 with P is performed in a first processing chamber, and the doping of the source/drain regions 201 with P is performed in a second processing chamber. In some embodiments, the formation of the antimony-doped semiconductor layer 204 is performed in a first processing chamber, and the formation of the source/drain regions 201 is performed in a second processing chamber.

Figure 4D:
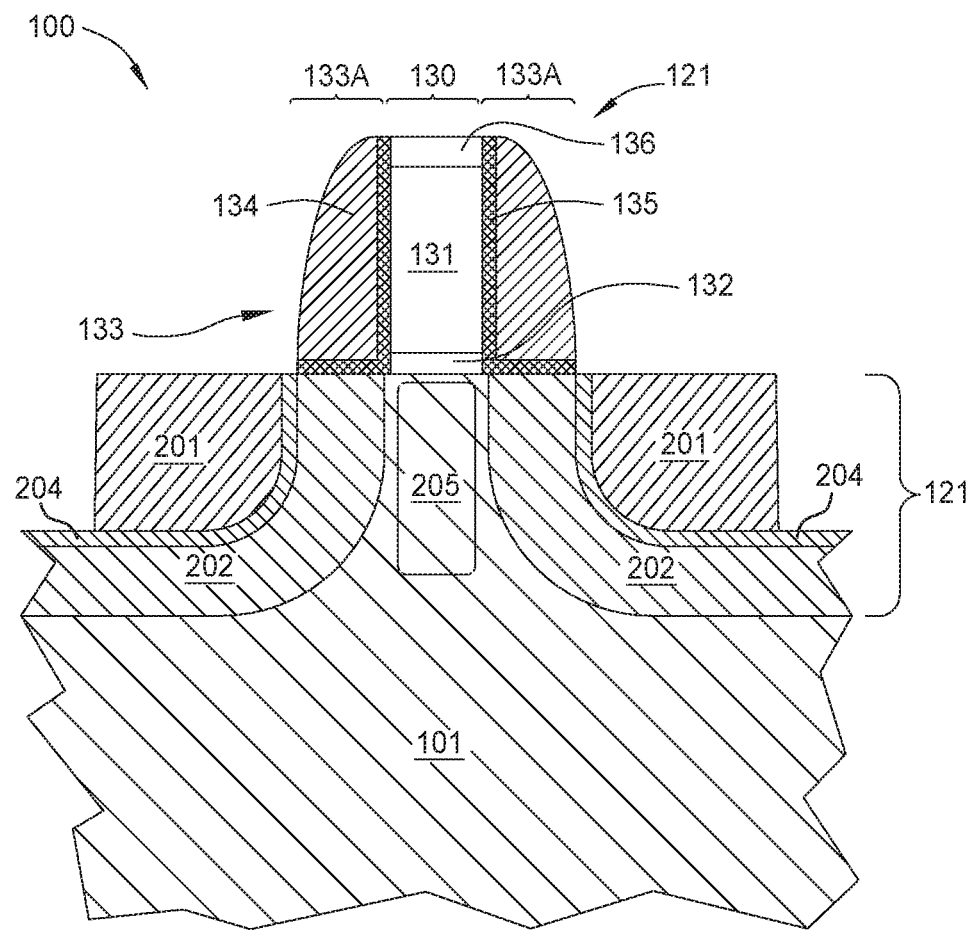

At operation 308, the source/drain regions 201 are formed on the antimony-doped semiconductor layer 204, as illustrated in FIG. 4D, according to one embodiment. The source/drain regions 201 can be formed by any suitable method, such as epitaxial deposition process. The source/drain extension regions 202 can have a smaller dopant concentration compared to the source/drain regions 201. For example, each source/drain extension region 202 has a dopant concentration grading from about 1E17 atoms/cm$^3$ to about 2E20 atoms/cm$^3$. The dopant in the source/drain regions 201 can be the same as or different from the dopant in the source/drain extension regions 202. Forming the source/drain regions 201 can include a thermal treatment, such as an anneal, according to one embodiment. The thermal treatment process can be a spike anneal process performed at temperatures of about 900° C. to about 1200° C. at a time for about 1 seconds to about 30 sec.

Forming the source/drain regions 201 includes co-flowing a Si containing precursor and a P containing precursor, according to one embodiment. Examples of the Si containing precursor are any given above. Examples of the P containing precursor are any given above. Forming the source/drain regions 201 includes co-flowing a Si containing precursor and a Sb containing precursor, according to one embodiment.

Examples of the Sb containing precursor include any given above. Forming the source/drain regions 201 includes co-flowing a Si containing precursor, a P containing precursor, and a Sb containing precursor, according to one embodiment. Co-flowing the three precursors allows for doping the source/drain regions 201 with both P and Sb.

Forming the source/drain regions 201 can include depositing the source/drain regions in a first step, and then doping the source/drain regions in a second step. In some embodiments, the doping of the source/drain regions 201 with P is performed in a first processing chamber, and the doping of the source/drain regions with Sb is performed in a second processing chamber.

As described above, a method for forming a transistor includes forming a gate electrode structure and a gate spacer over a semiconductor fin, removing a portion of the semiconductor fin, forming an antimony-doped semiconductor layer on the semiconductor fin, and forming a source/drain region on the antimony-doped semiconductor layer. The transistor includes an antimony-doped semiconductor layer between the source/drain extension regions and the source/drain regions. The source/drain regions could also include antimony dopants.

By utilizing an antimony-doped semiconductor layer between the source/drain regions and source/drain extension regions, doping of the source/drain extension regions is controlled. The co-doping of the Sb and P in the source/drain regions prevent migration of the P atoms from the source/drain regions to the source/drain extension regions. Sb is less toxic than other dopants used in the art, such as arsenic. In addition, the Sb in the source/drain regions counteracts the strain of P dopants, reducing P diffusion.

While the foregoing is directed to embodiments of the present disclosure, other and further embodiments of the disclosure may be devised without departing from the basic scope thereof, and the scope thereof is determined by the claims that follow.

What is claimed is:

1. A transistor, comprising:
   a gate electrode structure disposed over a channel region;
   a source extension region and a drain extension region disposed adjacent to the channel region;
   an antimony doped semiconductor layer, a bottom surface of the antimony-doped semiconductor layer fully disposed over each of the source extension region and the drain extension region; and
   a source region and a drain region disposed on the antimony doped semiconductor layer, the source region and the drain region comprising antimony (Sb).

2. The transistor of claim 1, wherein the gate electrode structure comprises:
   a gate dielectric layer;
   a gate electrode layer having one or more sidewalls, the gate electrode layer disposed over the gate dielectric layer; and
   one or more gate spacers disposed on the one or more sidewalls.

3. The transistor of claim 2, wherein the gate spacers are disposed over the source extension region and the drain extension region.

4. The transistor of claim 1, wherein the source region and the drain region each comprise a first dopant having a first dopant concentration, the first dopant comprising phosphorus.

5. A method for forming a transistor, comprising:
   forming an antimony-doped semiconductor layer having a thickness ranging from 1 nm to 10 nm;
   forming a source extension region and a drain extension region, each of the source extension region and the drain extension region disposed adjacent to a channel region and under a gate electrode structure; and
   forming a source region on the source extension region and a drain region on the drain extension region, the source region and the drain region both comprising antimony (Sb), wherein the antimony-doped semiconductor layer surrounds an entire bottom surface of the source region and the drain region and the antimony-doped semiconductor layer is fully disposed over the source extension region and the drain extension region.

6. The method of claim 5, wherein the forming the source region and the drain region comprises flowing a precursor comprising antimony (Sb) along with an etchant.

7. The method of claim 5, wherein the forming the source region and the drain region comprises doping the source region and the drain region with phosphorus.

8. The method of claim 5, wherein the forming an antimony-doped semiconductor layer comprises doping the source extension region and the drain extension region.

9. A method for forming a transistor, comprising:
   forming a gate electrode structure and a gate spacer over a first portion of a semiconductor fin, a second portion of the semiconductor fin being exposed;
   removing the second portion of the semiconductor fin to expose a portion of the semiconductor fin having a side wall and a bottom;
   forming an antimony-doped semiconductor layer on the portion of the semiconductor fin; and
   forming both a source region and a drain region on the antimony-doped semiconductor layer, the source region and the drain region both comprising antimony (Sb), wherein an entire bottom surface of the antimony-doped semiconductor layer is in contact with a source extension region and a drain extension region.

10. The method of claim 9, wherein the removing the second portion comprises an anisotropic etch process.

11. The method of claim 9, wherein the forming the source region and the drain region comprises doping the source region and the drain region with phosphorus.

12. The method of claim 11, wherein the source region and the drain region have an antimony concentration from about 1E19 atoms/cm$^3$ to about 1E21 atoms/cm$^3$.

13. The method of claim 9, wherein the forming the source region and the drain region further comprises a thermal treatment process, wherein the thermal treatment process comprises a spike anneal process performed at temperatures of 900° C. to 1200° C. for a time ranging from 1 second to 30 seconds.

14. The transistor of claim 1, wherein the antimony-doped semiconductor layer has a thickness ranging from 1 nm to 10 nm.

15. The transistor of claim 1, wherein the source/drain extension regions has a dopant concentration ranging from 1E17 atoms/cm$^3$ to 2E20 atoms/cm$^3$.

16. The transistor of claim 1, wherein the source/drain has an antimony concentration ranging from 1E19 atoms/cm$^3$ to 1E21 atoms/cm$^3$.

17. The method of claim 5, wherein the forming of a source region and a drain region comprises co-flowing a silicon-containing precursor, a phosphorus-containing precursor, and a Sb containing precursor in order to dope the source region and the drain region with both P and Sb.

18. The method of claim 5, wherein the source and the drain region have an antimony dopant concentration ranging from 1E19 atoms/cm$^3$ to 1E21 atoms/cm$^3$.

19. The method of claim 5, wherein the source and the drain extension region have a dopant concentration ranging from 1E17 atoms/cm$^3$ to 2E20 atoms/cm$^3$.

20. The method of claim 5, wherein the forming an antimony-doped semiconductor layer further comprises performing the deposition process at a chamber pressure ranging from 1 torr to 600 torr and at a deposition temperature ranging from 500° C. to 700° C.

* * * * *